(12) United States Patent
Onuki et al.

(10) Patent No.: US 10,177,190 B2
(45) Date of Patent: Jan. 8, 2019

(54) SOLID-STATE IMAGE PICKUP DEVICE

(71) Applicant: CANON KABUSHIKI KAISHA, Tokyo (JP)

(72) Inventors: Yusuke Onuki, Fujisawa (JP); Yuichiro Yamashita, Ebina (JP); Masahiro Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/656,979

(22) Filed: Jul. 21, 2017

(65) Prior Publication Data

US 2017/0323921 A1    Nov. 9, 2017

Related U.S. Application Data

(63) Continuation of application No. 14/466,809, filed on Aug. 22, 2014, now Pat. No. 9,748,302, which is a continuation of application No. 13/500,054, filed as application No. PCT/JP2010/005978 on Oct. 6, 2010, now Pat. No. 8,847,346.

(30) Foreign Application Priority Data

Oct. 9, 2009    (JP) ................................. 2009-235087

(51) Int. Cl.
    *H01L 27/146*    (2006.01)
(52) U.S. Cl.
    CPC .. *H01L 27/14643* (2013.01); *H01L 27/14609* (2013.01)

(58) Field of Classification Search
    CPC .................... H01L 27/14643; H01L 27/14609
    See application file for complete search history.

(56) References Cited

U.S. PATENT DOCUMENTS

| | | | | |
|---|---|---|---|---|
| 2003/0209712 A1* | 11/2003 | Fujita | ................ | H01L 27/14609 257/72 |
| 2005/0035375 A1* | 2/2005 | Hirata | ................ | H01L 27/1463 257/225 |
| 2006/0046338 A1* | 3/2006 | Patrick | .............. | H01L 27/14609 438/57 |
| 2007/0141772 A1* | 6/2007 | Nagano | ............. | H01L 21/82385 438/199 |
| 2007/0235827 A1* | 10/2007 | Altice | ............... | H01L 27/14609 257/428 |
| 2009/0040502 A1 | 2/2009 | Hashimoto | | |
| 2009/0251582 A1 | 10/2009 | Oike | | |
| 2009/0256176 A1* | 10/2009 | Kobayashi | ........ | H01L 27/14603 257/225 |

\* cited by examiner

*Primary Examiner* — Steven Loke
*Assistant Examiner* — Juanita Rhodes
(74) *Attorney, Agent, or Firm* — Canon U.S.A., Inc. IP Division

(57) ABSTRACT

A photoelectric conversion portion, a charge holding portion, a transfer portion, and a sense node are formed in a P-type well. The charge holding portion is configured to include an N-type semiconductor region, which is a first semiconductor region holding charges in a portion different from the photoelectric conversion portion. A P-type semiconductor region having a higher concentration than the P-type well is disposed under the N-type semiconductor region.

20 Claims, 13 Drawing Sheets

SOLID-STATE IMAGE PICKUP DEVICE

CROSS-REFERENCE TO RELATED APPLICATION

This application is a Continuation of U.S. patent application Ser. No. 14/466,809 filed Aug. 22, 2014; which is a Continuation of U.S. patent application Ser. No. 13/500,054 filed Apr. 3, 2012, which now becomes U.S. Pat. No. 8,847,346, issued Sep. 30, 2014; which is a National Phase application of International Application PCT/JP2010/005978 filed Oct. 6, 2010, which claims the benefit of Japanese Patent Application No. 2009-235087, filed Oct. 9, 2009. The disclosures of the above-named applications are hereby incorporated by reference herein in their entirety.

TECHNICAL FIELD

The present invention relates to a solid-state image pickup device. More specifically, the present invention relates to a solid-state image pickup device in which each of pixels has a charge holding portion.

BACKGROUND ART

In recent years, a configuration in which each of pixels has a charge holding portion isolated from a photoelectric conversion portion and a floating diffusion (hereinafter FD) has been considered for higher performance of a solid-state image pickup device. Firstly, the charge holding portion is provided in each pixel for realizing a global electronic shutter, as described in PTL 1. Secondly, the charge holding portion is provided in each pixel for expanding a dynamic range, as described in PTL 2. Thirdly, the charge holding portion is provided in each pixel for realizing a configuration having an analog-to-digital (AD) converter for each pixel, as described in PTL 3.

PTL 1 discloses a configuration of reducing noise by suppressing inflow of charges generated at a deep position of a semiconductor region into a charge holding portion. Specifically, PTL 1 discloses a configuration including a P-type well having a photoelectric conversion portion therein, a charge holding portion, and a P-type semiconductor layer that is provided under at least part of the charge holding portion via part of the P-type well and that has a higher impurity concentration than the P-type well.

CITATION LIST

Patent Literature

[PTL 1] Japanese Patent Laid-Open No. 2008-004692
[PTL 2] Japanese Patent Laid-Open No. 2006-197383
[PTL 3] Japanese Patent Laid-Open No. 2009-038167

SUMMARY OF INVENTION

Technical Problem

The inventor has found that, in the configuration disclosed in PTL 1, a problem arises in that a drive voltage for transferring charges from the charge holding portion to the FD is high. As illustrated in FIG. 3 of PTL 1, the high-concentration P-type layer is disposed under the charge holding portion via the P-type well. The charge holding portion forms a PN junction together with the P-type well, which has a low concentration. Therefore, a depletion layer from the N-type region of the charge holding portion expands to the P-type well, so that a high voltage is necessary to transfer charges.

Furthermore, the inventor has found that a transfer path may narrow and transfer efficiency may decrease depending on a positional relationship between the high-concentration P-type layer and the charge transfer path extending from the charge holding portion to the FD.

In view of those problems, an embodiment of the present invention is directed to enabling transfer of charges at a low voltage, firstly by suppressing expansion of a depletion layer during transfer of charges from a charge holding portion to an FD, and secondly by preventing narrowing down of the transfer path between the charge holding portion and the FD.

Solution to Problem

A solid-state image pickup device according to an aspect of the present invention is a solid-state image pickup device including a pixel. The pixel includes a photoelectric conversion portion configured to generate charges in accordance with incident light, a charge holding portion configured to include a first-conductivity-type first semiconductor region that holds the charges generated by the photoelectric conversion portion in a portion different from the photoelectric conversion portion, and a transfer portion configured to include a transfer gate electrode that controls a potential between the charge holding portion and a sense node. A second-conductivity-type second semiconductor region is disposed under the first semiconductor region so as to form a PN junction together with the first semiconductor region. A second-conductivity-type impurity concentration of the second semiconductor region is higher than a second-conductivity-type impurity concentration of a region that is under the transfer gate electrode and that is at the same depth as the second semiconductor region.

A solid-state image pickup device according to another aspect of the present invention is a solid-state image pickup device including a pixel. The pixel includes a photoelectric conversion portion configured to generate charges in accordance with incident light, a charge holding portion configured to include a first-conductivity-type first semiconductor region that holds the charges generated by the photoelectric conversion portion in a portion different from the photoelectric conversion portion, and a transfer portion configured to include a transfer gate electrode that controls a potential between the charge holding portion and a sense node. A second-conductivity-type second semiconductor region is disposed under the first semiconductor region. A second-conductivity-type impurity concentration of the second semiconductor region is higher than a second-conductivity-type impurity concentration of a region that is under the transfer gate electrode and that is at the same depth as the second semiconductor region.

A solid-state image pickup device according to still another aspect of the present invention is a solid-state image pickup device including a pixel. The pixel includes a photoelectric conversion portion configured to generate charges in accordance with incident light, a charge holding portion configured to include a first-conductivity-type first semiconductor region that holds the charges generated by the photoelectric conversion portion in a portion different from the photoelectric conversion portion, and a transfer portion configured to include a transfer gate electrode that controls a potential between the charge holding portion and a sense node. A second-conductivity-type second semiconductor region is disposed under the first semiconductor region. The first semiconductor region and the second semiconductor region are disposed in a semiconductor substrate. An area of the first semiconductor region that is projected onto a surface parallel to a surface of the semiconductor substrate is equal to an area of the second semiconductor region that is projected onto a surface parallel to the surface of the semiconductor substrate.

Advantageous Effects of Invention

In the solid-state image pickup device according to an embodiment of the present invention, expansion of a depletion layer can be suppressed when charges accumulated in a charge holding portion are transferred, and also narrowing down of a charge transfer path can be suppressed.

Further features of the present invention will become apparent from the following description of exemplary embodiments with reference to the attached drawings.

DESCRIPTION OF EMBODIMENTS

Hereinafter, embodiments of the present invention will be described in detail below with reference to the attached drawings. In each of the embodiments, electrons are used as signal charges. However, holes may be used as signal charges. In a case where electrons are used as signal charges, a first-conductivity-type is N-type, and a second-conductivity-type is P-type. In a case where holes are used as signal charges, the conductivity type of each semiconductor region may be reversed with respect to the case where electrons are used as signal charges. The schematic cross-sectional view in each embodiment illustrates only one pixel, but actually a plurality of pixels are arranged in a matrix, for example.

First Embodiment

Figure 1:
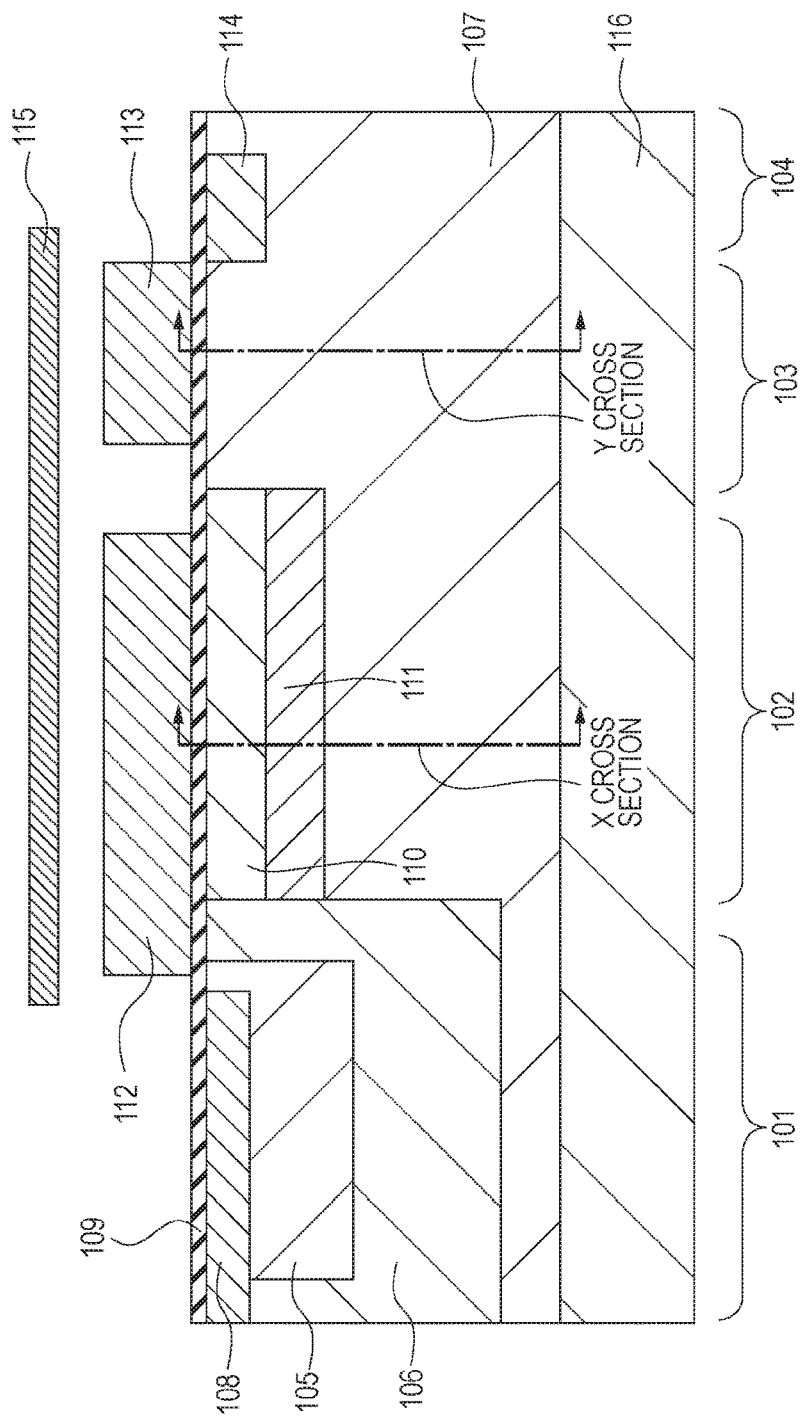
FIG. 1 is a schematic view of a cross section of a pixel of a solid-state image pickup device according to a first embodiment of the present invention.

FIG. 1 is a schematic view of a cross section of a pixel of a solid-state image pickup device according to an embodiment of the present invention. Reference numeral 101 denotes a photoelectric conversion portion. A photodiode configured to include a P-type semiconductor region and an N-type semiconductor region is used, for example. Reference numeral 102 denotes a charge holding portion. The charge holding portion 102 is configured to include an N-type semiconductor region capable of holding charges generated by the photoelectric conversion portion 101. Reference numeral 103 denotes a transfer portion. The transfer portion 103 transfers charges held by the charge holding portion 102 to a sense node. Reference numeral 104 denotes the sense node. The sense node 104 is configured to include a floating diffusion (FD) that is electrically connected to the gate of a pixel amplification metal oxide semiconductor (MOS) transistor, for example. The FD may be electrically connected to a vertical signal line (not illustrated), instead of being electrically connected to the gate of the pixel amplification MOS transistor.

Next, specific configurations of the foregoing individual members will be described. In this embodiment, the photoelectric conversion portion 101, the charge holding portion 102, the transfer portion 103, and the sense node 104 are arranged in a P-type well 107. The P-type well 107 is formed on one of principal surfaces of an N-type substrate 116 through ion implantation or epitaxial growth. A P-type substrate may be used instead of the N-type substrate 116 on which the P-type well 107 is formed.

Also, a pixel structure may be disposed on an N-type substrate that is formed through epitaxial growth. An advantage of this configuration is that, since a P-type buried layer serves as a potential barrier, charges generated by the photoelectric conversion portion 101 are unlikely to be discharged to the substrate. Thus, a pixel structure may be disposed on the N-type substrate that is formed through epitaxial growth, in order to increase the sensitivity. In a configuration where the impurity concentration of the N-type semiconductor region in the photoelectric conversion portion 101 is low and where generated charges are immediately transferred to the charge holding portion 102 without being accumulated in the photoelectric conversion portion 101, the effect of increasing the sensitivity using the N-type substrate becomes particularly significant.

Reference numerals 105 and 106 denote N-type semiconductor regions. The N-type semiconductor region 105 is disposed in the N-type semiconductor region 106 and has an N-type impurity concentration higher than that of the N-type semiconductor region 106. The N-type semiconductor region 105 forms a PN junction together with a P-type semiconductor region 108. The N-type semiconductor region 106 forms a PN junction together with the P-type well 107 that is disposed under the N-type semiconductor region 106.

The P-type semiconductor region 108 is a high-concentration P-type semiconductor region. Providing the P-type semiconductor region 108 enables reduction of a dark current that is generated on a surface of semiconductor. In this embodiment, the foregoing photoelectric conversion portion 101 is constituted by the N-type semiconductor regions 105 and 106, the P-type well 107, and the P-type semiconductor region 108.

Reference numeral 110 denotes an N-type semiconductor region. In this embodiment, the N-type semiconductor region 110 functions as a first semiconductor region that holds charges in a portion different from the photoelectric conversion portion 101. Reference numeral 112 denotes a control electrode. The foregoing charge holding portion 102 is configured to include the N-type semiconductor region 110 and the control electrode 112.

The charge holding portion 102 according to this embodiment includes the control electrode 112, which is disposed above the N-type semiconductor region 110 via an insulating film 109. The control electrode 112 controls the potential on a semiconductor surface side of the N-type semiconductor region 110. A negative voltage may be applied to the control electrode 112 so as to suppress an influence of a dark current generated in the charge holding portion 102.

The control electrode 112 may also have a function of controlling a potential between the photoelectric conversion portion 101 and the charge holding portion 102. Alternatively, a distinct electrode from the control electrode 112 may be disposed for controlling the potential between the photoelectric conversion portion 101 and the charge holding portion 102.

An embodiment of the present invention can be applied to a configuration that does not include the control electrode 112. For example, the N-type semiconductor region 110 may be selectively connected to the power source via a contact plug and a switch.

Reference numeral 113 denotes a transfer gate electrode. A voltage supplied to the transfer gate electrode 113 forms a transfer path of signal charges in part of the P-type well 107 adjacent to the N-type semiconductor region 110. The transfer gate electrode 113 is disposed so that a transfer path is formed at a position where signal charges can be transferred from the charge holding portion 102 to the sense node 104 described below. The transfer gate electrode 113 switches between a state where the transfer path is formed and a state where the transfer path is not formed in accordance with a voltage supplied thereto, so as to control the electrical connection between the charge holding portion 102 and the sense node 104.

An FD 114 is an N-type semiconductor region. In this embodiment, the FD 114 functions as a sense node. The sense node may be a semiconductor region from which a signal is output in accordance with the amount of charges accumulated therein. The sense node may have a configuration of being shared by a plurality of pixels.

Reference numeral 115 denotes a light shielding member. The light shielding member 115 reduces incident light to the charge holding portion 102, the transfer portion 103, and the sense node 104, or completely blocks incident light thereto.

Reference numeral 111 denotes a high-concentration P-type semiconductor region, which is a feature of this embodiment. The P-type semiconductor region 111 is disposed under the N-type semiconductor region 110. The P-type semiconductor region 111 and the N-type semiconductor region 110 directly form a PN junction without via the P-type well 107. That is, in this embodiment, the P-type semiconductor region 111 is a second semiconductor region that is disposed under the N-type semiconductor region 110 so as to form a PN junction together with the N-type semiconductor region 110.

Figure 11:
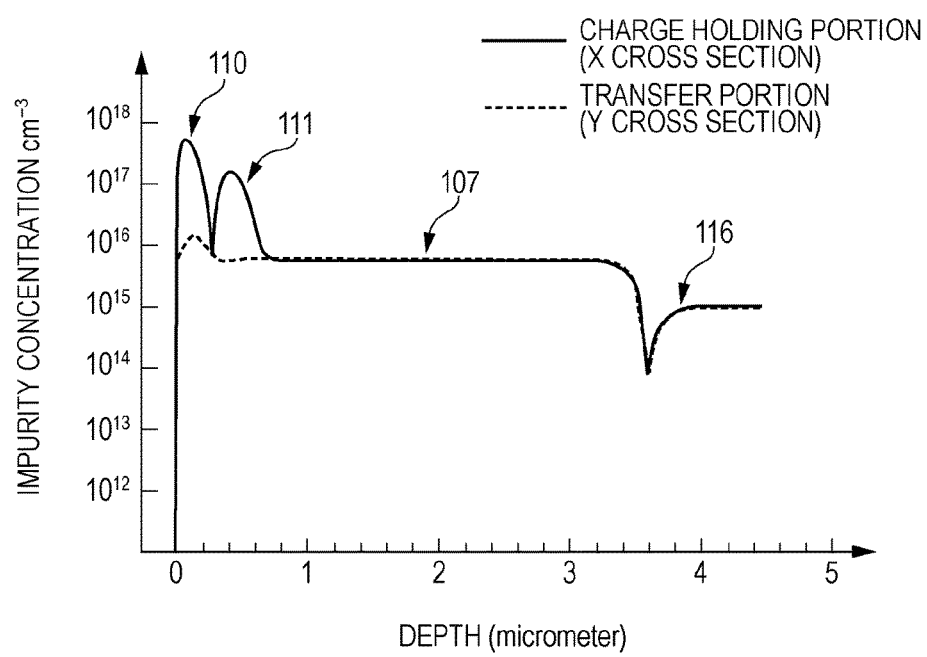
FIG. 11 illustrates an impurity concentration profile of the solid-state image pickup device according to the first embodiment of the present invention.

FIG. 11 illustrates an impurity concentration profile along a depth direction in each of the charge holding portion 102 (X cross section in FIG. 1) and the transfer portion 103 (Y cross section in FIG. 1). The depth direction is a direction vertical to the surface of semiconductor. The impurity concentration of the P-type semiconductor region 111 is higher than the impurity concentration of the P-type well 107.

As illustrated in FIG. 11, the impurity concentration profile in the depth direction of the P-type semiconductor region 111 may be a profile having an impurity concentration peak at a certain depth. The peak of the impurity concentration of the P-type semiconductor region 111 may be at a position shallower than 0.5 micrometers from the surface. Even if the peak is at a deeper position than this, an effect of this embodiment can be obtained if the P-type semiconductor region 111 and the N-type semiconductor region 110 directly form a PN junction without via the P-type well 107. However, when the peak is at a position shallower than 0.5 micrometers from the surface, a region of a low impurity concentration is not formed between the N-type semiconductor region 110 and the P-type semiconductor region 111, and thus a greater effect can be obtained. Since the P-type semiconductor region 111 is disposed under the N-type semiconductor region 110, the impurity concentration peak of the P-type semiconductor region 111 is at a deeper position than the impurity concentration peak of the N-type semiconductor region 110.

As illustrated in FIG. 11, at the depth where the impurity concentration peak of the P-type semiconductor region 111 exists, the impurity concentration of the P-type semiconductor region 111 is higher than the impurity concentration of a region at the same depth under the transfer gate electrode 113. In other words, under at least part of the transfer gate electrode 113, the P-type semiconductor region 111 does not exist, or even though the P-type semiconductor region 111 exists under the transfer gate electrode 113, the impurity concentration is lower than that of the P-type semiconductor region 111 under the N-type semiconductor region 110. Here, if the conductivity type of the semiconductor region under the transfer gate electrode 113, at the same depth as the P-type semiconductor region 111, is opposite to that of the P-type semiconductor region 111, that is, N-type, the P-type semiconductor region 111 has a higher P-type impurity concentration.

Figure 12:
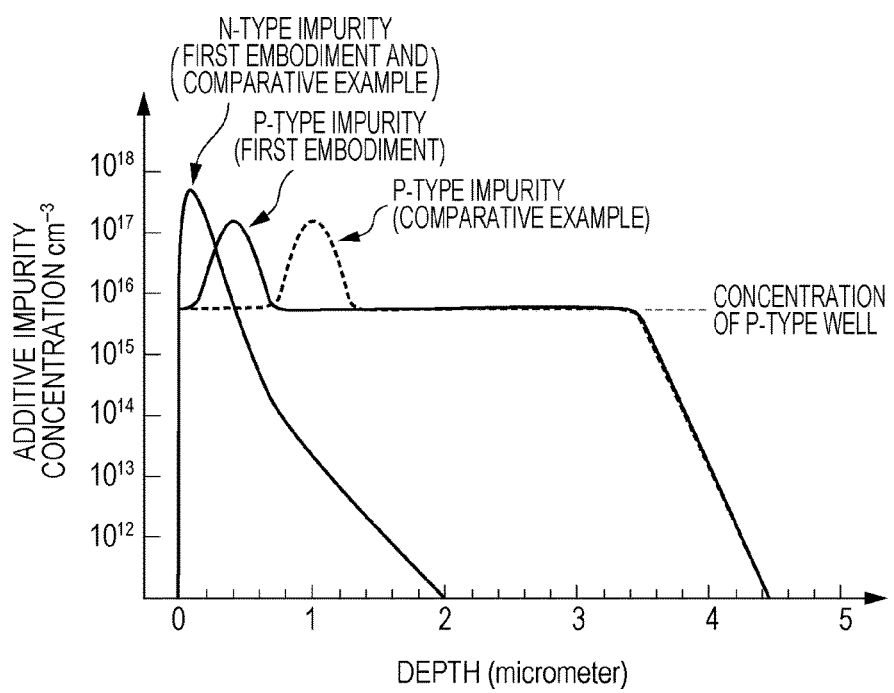
FIG. 12 illustrates an additive impurity concentration profile of the solid-state image pickup device according to the first embodiment of the present invention.

Next, a detailed description will be given of that the P-type semiconductor region 111 and the N-type semiconductor region 110 form a PN junction. FIG. 12 illustrates an additive impurity concentration profile along a direction vertical to the surface of semiconductor in the charge holding portion 102 (X cross section in FIG. 1). The "additive impurity concentration" means the concentration of impurity that is actually added. On the other hand, the "impurity concentration" in this specification, the claims, and the drawings means the net impurity concentration that is compensated for by the impurities of the opposite conductivity type. In FIG. 12, the region where the P-type additive impurity concentration is higher than the N-type additive impurity concentration is a P-type semiconductor region. In contrast, the region where the N-type additive impurity concentration is higher than the P-type additive impurity concentration is an N-type semiconductor region.

In FIG. 12, the peak of the additive impurity concentration of the P-type impurity corresponds to the impurity concentration peak of the P-type semiconductor region 111.

In FIG. 12, the portion where the additive impurity concentration of the N-type impurity is equal to that of the P-type impurity is an interface of a PN junction. If the P-type additive impurity concentration at the PN junction interface is higher than the additive impurity concentration of the P-type well, it may be said that the P-type semiconductor region 111 and the N-type semiconductor region 110 directly form a PN junction.

Now, a description will be given of the P-type well which is a comparison target of additive impurity concentration. In this embodiment, impurities are distributed almost uniformly in the P-type well 107 illustrated in FIG. 1. In this case, the additive impurity concentration of the P-type well 107 as a comparison target may be, for example, the additive impurity concentration of the semiconductor region under the transfer gate electrode 113 at the same depth as the peak of the impurity concentration of the P-type semiconductor region 111.

Impurities may be added to a transfer path in order to control the voltage to be supplied to the transfer gate electrode 113. In such a configuration, the additive impurity concentration of the semiconductor region under the transfer gate electrode 113 is higher than the additive impurity concentration of the P-type well, and the distribution of the impurity concentration of the P-type well 107 in FIG. 1 is not uniform. In this case, the additive impurity concentration of the P-type well 107 that is disposed under the photoelectric conversion portion 101 is regarded as a comparison target. This is because, even if impurities are added to the transfer path, the additive impurity concentration in the lower portion of the photoelectric conversion portion 101 does not change.

In FIG. 12, a curve in a solid line indicates the additive impurity concentration according to this embodiment, and a curve in a dotted line indicates the additive impurity concentration according to a comparative example. At the PN junction interface according to the comparative example, the additive impurity concentration of the P-type impurity is equal to the additive impurity concentration of the P-type well. In this case, the P-type semiconductor region 111 and the N-type semiconductor region 110 do not form a PN junction directly with each other.

With the configuration according to this embodiment described above, charges can be transferred from the charge holding portion 102 to the sense node 104 at a low voltage. This will be described in detail.

First, a mechanism of transferring charges from the charge holding portion 102 to the sense node 104 will be described. Before signal charges generated in the photoelectric conversion portion 101 are held in the N-type semiconductor region 110, a reset voltage is supplied to the N-type semiconductor region 110 via the sense node 104. Then, after the N-type semiconductor region 110 has been turned floating, charges in the photoelectric conversion portion 101 are transferred to the N-type semiconductor region 110. Then, the charges are sequentially transferred from the charge holding portion 102 to the sense node 104. The transfer is performed on a row-by-row basis in ordinary cases. At this time, the N-type semiconductor region 110 is in a state where a reverse bias is applied via the transfer portion 103. The reverse bias causes the N-type semiconductor region 110 to be depleted, so that the charges are transferred. In order to transfer most of or, preferably, all of the charges held in the N-type semiconductor region 110 to the sense node 104, the most part of or, preferably, the entire region of the N-type semiconductor region 110 needs to be depleted.

When the N-type semiconductor region 110 is depleted, a depletion layer expands into the P-type semiconductor region 111 under the N-type semiconductor region 110. The amount of expansion of the depletion layer from the N-type semiconductor region 110 varies in accordance with the impurity concentration of the P-type semiconductor region 111 that forms a PN junction together with the N-type semiconductor region 110.

For easy understanding of the effect of this embodiment, a description will be given in comparison with the configuration disclosed in PTL 1. According to the configuration illustrated in FIG. 3 of PTL 1, a high-concentration P-type semiconductor region is disposed under an N-type semiconductor region constituting a charge holding portion via a P-type well. When the N-type semiconductor region forms a PN junction together with a low-concentration P-type well as in the configuration disclosed in PTL 1, a depletion layer widely expands in the P-type well. In this case, a reverse bias voltage supplied via a transfer portion needs to be high in order to sufficiently deplete the N-type semiconductor region.

On the other hand, in this embodiment, the N-type semiconductor region 110 and the P-type semiconductor region 111 form a PN junction directly with each other without via the P-type well 107. Since the impurity concentration of the P-type semiconductor region 111, which forms a PN junction together with the N-type semiconductor region 110, is high, expansion of a depletion layer into the P-type semiconductor region 111 can be suppressed. Thus, even if the reverse bias voltage that is supplied via the transfer portion 103 is low, the most part of or the entire region of the N-type semiconductor region 110 is depleted.

Furthermore, in this embodiment, the impurity concentration of the P-type semiconductor region 111 is higher than the impurity concentration of the region under the transfer gate electrode 113 at the same depth as the P-type semiconductor region 111. In other words, the P-type semiconductor region 111 does not extend to the region under the transfer gate electrode 113. With this configuration, a transfer path is formed in the P-type well 107 under the transfer gate electrode 113 without increasing the bias voltage that is supplied to the transfer gate electrode 113.

Figure 2:
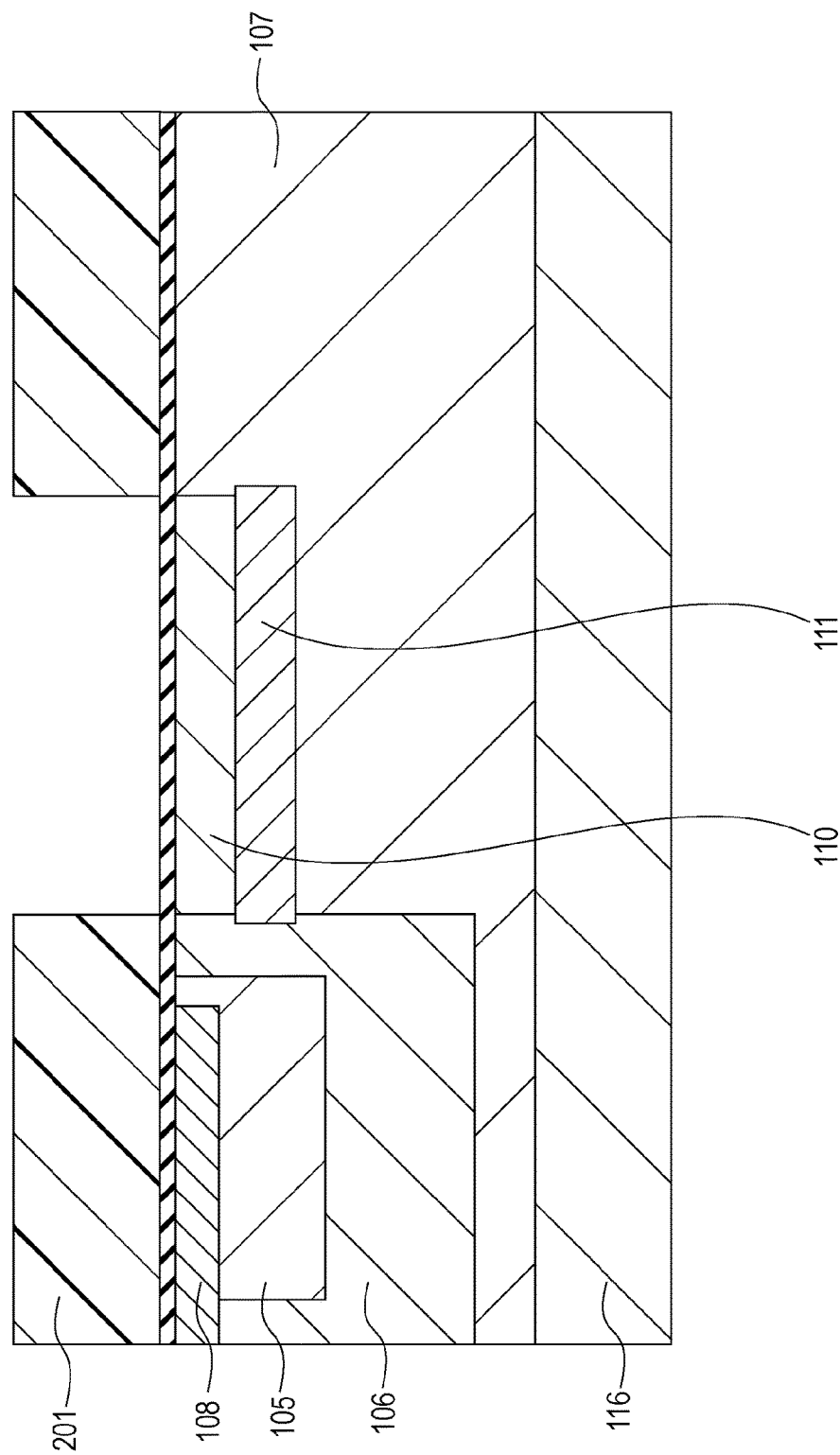
FIG. 2 is a diagram for explaining a method for manufacturing the solid-state image pickup device according to the first embodiment of the present invention.

Next, a method for manufacturing the P-type semiconductor region 111 according to this embodiment will be described. FIG. 2 is a schematic view of a cross section of a pixel when the P-type semiconductor region 111 is formed. Reference numeral 201 denotes a mask pattern formed of a photoresist or the like. The same parts as those in FIG. 1 are denoted by the same reference numerals, and a detailed description will be omitted.

First, a photoresist is formed over an entire surface of the substrate. Then, the photoresist is exposed so that an opening is formed in a region where the N-type semiconductor region 110 in the charge holding portion 102 is to be disposed.

As a first impurity implantation step for forming the N-type semiconductor region 110, N-type impurity ions are implanted using a photoresist pattern formed in the exposure step as a mask pattern. At this time, arsenic or phosphorus may be used as the impurity.

Subsequently, without a step of removing the photoresist mask, P-type impurity ions are implanted as a second impurity implantation step for forming the P-type semiconductor region 111. At this time, boron or the like may be used as the impurity. Then, heat treatment such as annealing is performed to recover from crystal defect or the like that occurs during ion implantation. In this way, the N-type semiconductor region 110 and the P-type semiconductor region 111 are formed using the identical mask pattern.

The first impurity implantation step of forming the N-type semiconductor region 110 and the second impurity implantation step of forming the P-type semiconductor region 111 may be performed in the reverse order.

According to the above-described manufacturing method, the P-type semiconductor region 111 can be formed without the necessity for significantly increasing the manufacturing steps. More specifically, the P-type semiconductor region 111 can be formed without a new mask patterning step. Furthermore, according to such a manufacturing method, displacement of the N-type semiconductor region 110 and the P-type semiconductor region 111 in the direction horizontal to the substrate surface can be reduced. Accordingly, the portion where the N-type semiconductor region 110 and the P-type semiconductor region 111 form a PN junction directly with each other can be increased.

Note that the above-described manufacturing method is not an essential method for manufacturing a solid-state image pickup device according to an embodiment of the present invention. The N-type semiconductor region 110 and the P-type semiconductor region 111 may be formed using different mask patterns.

As described above, according to this embodiment, expansion of a depletion layer can be suppressed when charges accumulated in the charge holding portion 102 are transferred, and furthermore, narrowing down of the charge transfer path is suppressed. Accordingly, charges can be transferred at a low voltage.

Second Embodiment

Figure 3:
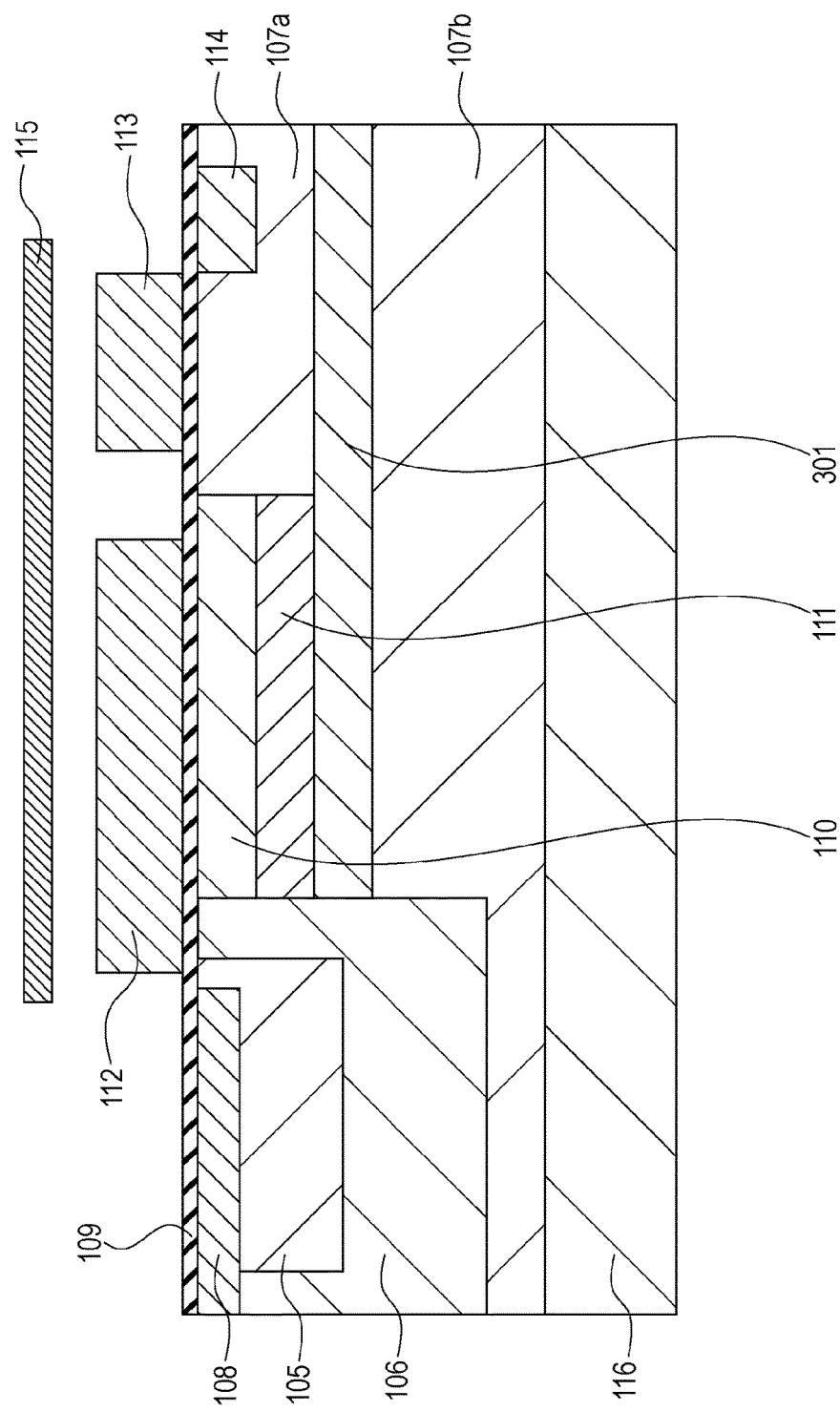
FIG. 3 is a schematic view of a cross section of a pixel of a solid-state image pickup device according to a second embodiment of the present invention.

FIG. 3 is a schematic view of a cross section of a pixel of a solid-state image pickup device according to a second embodiment of the present invention. The parts having the same function as that in the first embodiment are denoted by the same reference numerals, and a detailed description thereof will be omitted.

A difference between this embodiment and the first embodiment is that a P-type semiconductor region 301 is disposed under the P-type semiconductor region 111. As illustrated in FIG. 3, the P-type semiconductor region 301 extends to under the transfer path and the FD 114. In this embodiment, the P-type semiconductor region 301 functions as a third semiconductor region.

Figure 9:
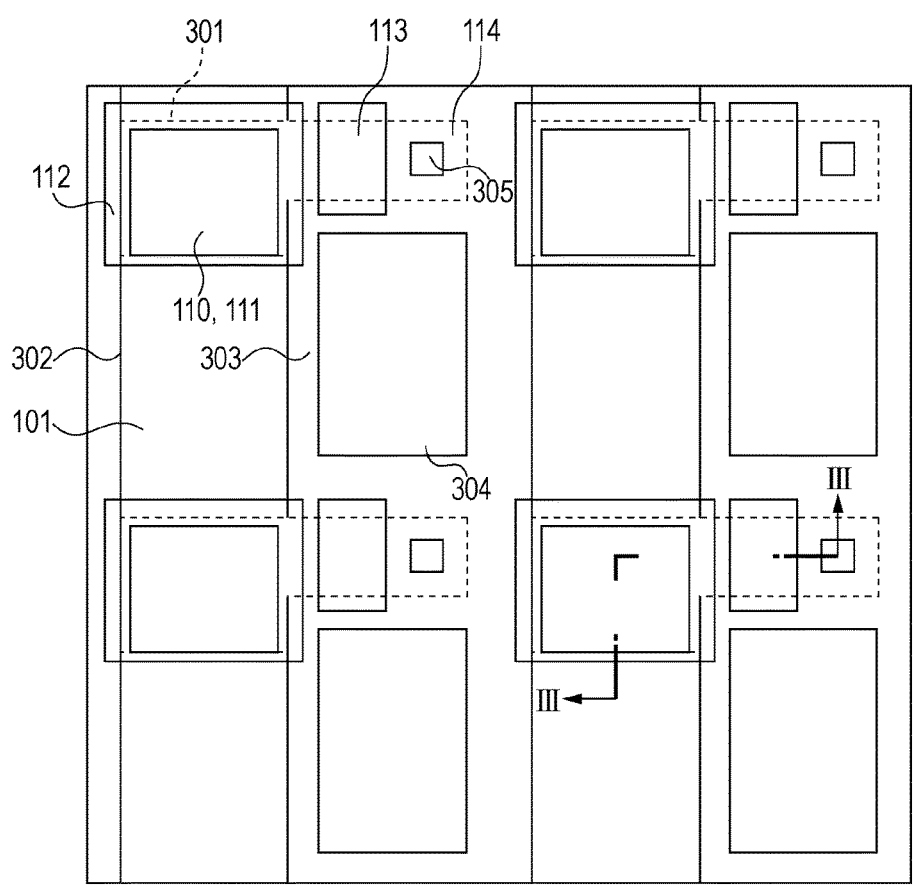
FIG. 9 is a top view of a pixel region of the solid-state image pickup device according to the second embodiment of the present invention.

FIG. 9 is a top view of a pixel region according to this embodiment. FIG. 9 illustrates only four pixels, but the solid-state image pickup device according to this embodiment may include more pixels. The parts having the same function as that in FIG. 1 or 3 are denoted by the same reference numerals. FIG. 3 illustrates a schematic view of the III-III cross section in FIG. 9.

Reference numeral 302 denotes an active region. In the active region 302, the photoelectric conversion portion 101, the P-type well 107, the N-type semiconductor region 110 that holds charges, the P-type semiconductor region 111, the transfer path, and the FD 114 are formed. Reference numeral 303 denotes a field region. A field oxide film is used for isolation of elements. Reference numeral 304 denotes a region where a pixel amplification MOS transistor, a reset MOS transistor, and the like are formed.

In this embodiment, the P-type semiconductor region 301 is formed in a region defined by a broken line in FIG. 9. That is, the P-type semiconductor region 301 is formed in the entire active region 302 except the photoelectric conversion portion 101. In this case, the P-type well 107 is divided into two regions 107a and 107b, as illustrated in FIG. 3. However, the P-type semiconductor region 301 is not necessarily disposed in the entire region under the P-type semiconductor region 111, the transfer gate electrode 113, and the FD 114.

In this embodiment, the additive impurity concentration of the P-type impurity at the PN junction interface between the P-type semiconductor region 111 and the N-type semiconductor region 110 is higher than the additive impurity concentration of the P-type well 107. In this embodiment, the P-type semiconductor region 301 is formed in the P-type well 107. In such a case, the additive impurity concentration of the semiconductor region under the transfer gate electrode 113 may be higher than the additive impurity concentration of the P-type well 107. Thus, the additive impurity concentration of the P-type well 107 in a lower portion of the photoelectric conversion portion 101 may be regarded as a comparison target.

According to the configuration of this embodiment, inflow of charges into the transfer path and the FD 114 can be suppressed. Accordingly, an effect that noise is reduced can be obtained in addition to the effect obtained in the first embodiment.

Third Embodiment

Figure 4:
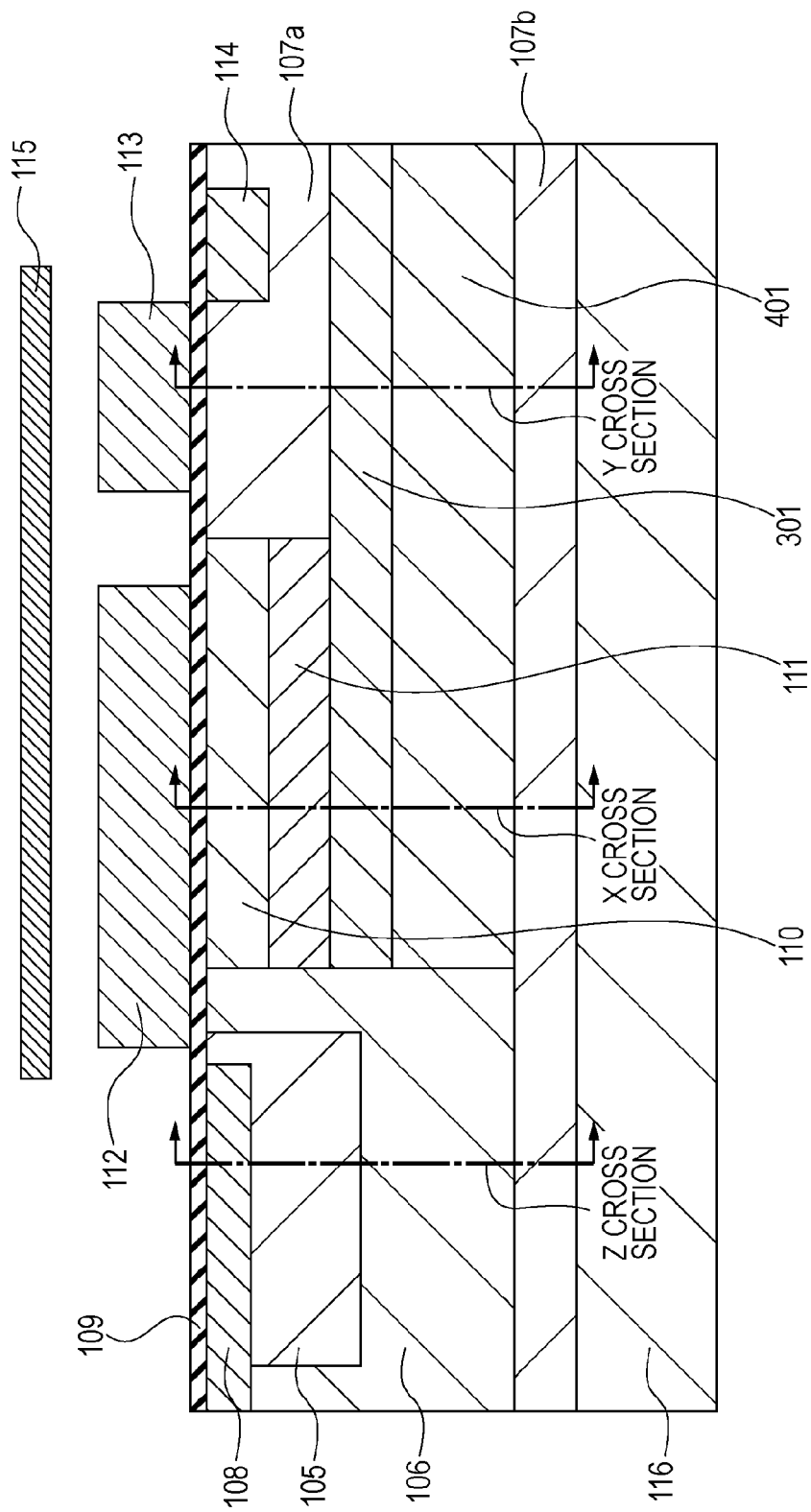
FIG. 4 is a schematic view of a cross section of a pixel of a solid-state image pickup device according to a third embodiment of the present invention.

FIG. 4 is a schematic view of a cross section of a pixel of a solid-state image pickup device according to a third embodiment of the present invention. The parts having the same function as those in the first and second embodiments are denoted by the same reference numerals, and a detailed description thereof will be omitted.

A difference between this embodiment and the second embodiment is that a P-type semiconductor region 401 is disposed under the P-type semiconductor region 301. The two P-type semiconductor regions 301 and 401 are disposed at different depths. As a result, a lower end of the P-type semiconductor region 401 is at the depth where the PN junction interface between the N-type semiconductor region 106 constituting part of the photoelectric conversion portion 101 and the P-type well 107 is disposed. In this embodiment, the P-type semiconductor regions 301 and 401 function as a third semiconductor region.

Figure 13:
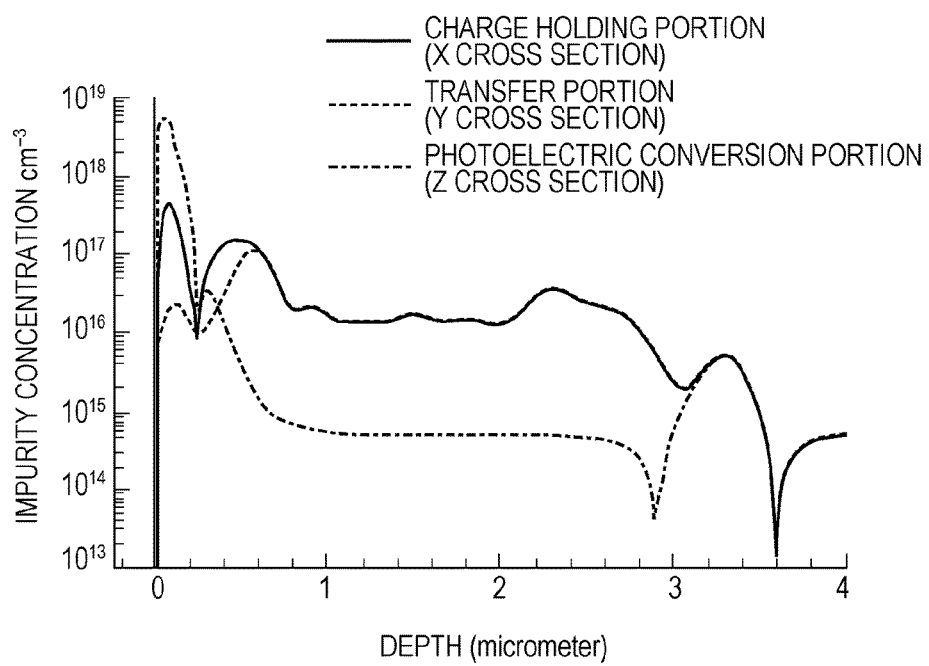
FIG. 13 illustrates an impurity concentration profile of the solid-state image pickup device according to the third embodiment of the present invention.

FIG. 13 illustrates an impurity profile along a depth direction in each of the charge holding portion 102 (X cross section in FIG. 4) and the transfer portion 103 (Y cross section in FIG. 4) according to this embodiment. At the depth where the peak of the P-type semiconductor region 111 exists, the impurity concentration of the P-type semiconductor region 111 is higher than the impurity concentration of the semiconductor region under the transfer path. At a deeper position than the P-type semiconductor region 111, the P-type semiconductor regions 301 and 401 are disposed under the P-type semiconductor region 111, the transfer gate electrode 113, and the FD 114. Thus, as illustrated in FIG. 13, the impurity profile along the depth direction is the same in the charge holding portion 102 and the transfer portion 103.

FIG. 13 also illustrates the impurity profile along the depth direction in the photoelectric conversion portion 101 (Z cross section in FIG. 4). As illustrated in FIG. 13, the lower end of the P-type semiconductor region 401 is at the depth where the N-type semiconductor region 106 in the photoelectric conversion portion 101 and the P-type well 107 form a PN junction.

In this embodiment, the P-type semiconductor regions 301 and 401 are formed through four ion implantation steps. The type of implanted ion is boron. The dose of ion implantation with the smallest acceleration energy is larger than the others so that the impurity concentration of an upper portion of the P-type semiconductor region 301 is high. The high impurity concentration of the upper portion of the P-type semiconductor region 301 is advantageous for reducing inflow of charges into the charge holding portion 102, etc.

In this embodiment, a plurality of semiconductor regions are formed at different depths through ion implantations with different acceleration energies, and those semiconductor regions constitute the P-type semiconductor regions 301 and 401. The manufacturing method is not limited to the forgoing method as long as the P-type semiconductor regions 301 and 401 are formed at different depths.

In FIG. 4, the P-type semiconductor region 401 is disposed under the region where the P-type semiconductor region 301 exists. That is, the P-type semiconductor region 401 is disposed in the region defined by the broken line in FIG. 9, for example.

In this embodiment, the additive impurity concentration of the P-type impurity at the PN junction interface between the P-type semiconductor region 111 and the N-type semiconductor region 110 is higher than the additive impurity concentration of the P-type well 107. In this embodiment, the P-type semiconductor regions 301 and 401 are formed in the P-type well 107. In such a case, the additive impurity concentration of the semiconductor region under the transfer gate electrode 113 may be higher than the additive impurity concentration of the P-type well 107. Then, the additive impurity concentration of the P-type well 107 in a lower portion of the photoelectric conversion portion 101 may be regarded as a comparison target.

According to the configuration of this embodiment, inflow of signal charges generated in the photoelectric conversion portion 101 into an adjacent pixel via the P-type well 107 can be suppressed. Accordingly, an effect that noise is further reduced can be obtained in addition to the effect obtained in the second embodiment.

Fourth Embodiment

Figure 5:
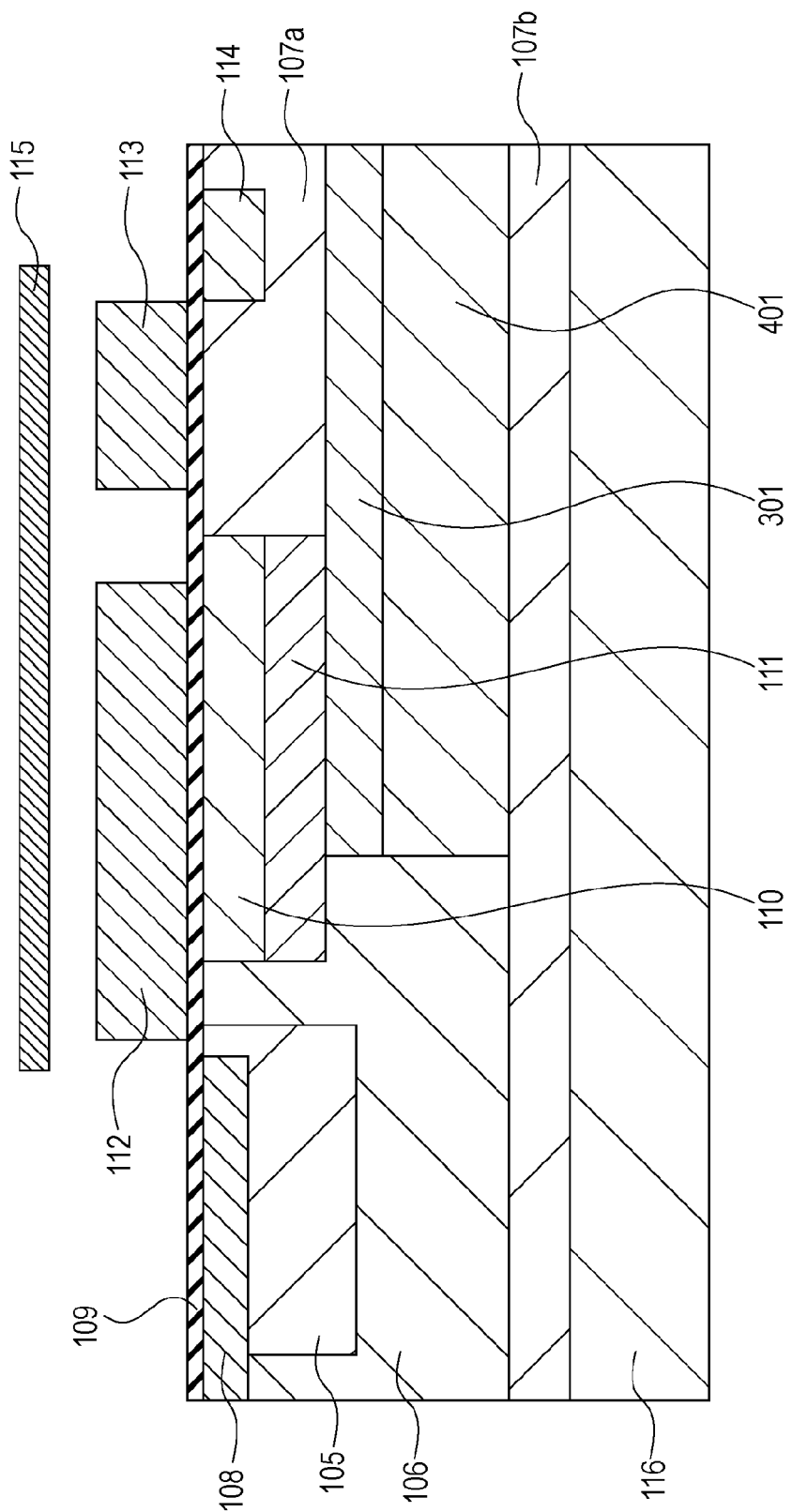
FIG. 5 is a schematic view of a cross section of a pixel of a solid-state image pickup device according to a fourth embodiment of the present invention.

FIG. 5 is a schematic view of a cross section of a pixel of a solid-state image pickup device according to a fourth embodiment of the present invention. The parts having the same function as those in any of the first to third embodiments are denoted by the same reference numerals, and a detailed description thereof will be omitted.

A difference between this embodiment and the third embodiment is that the end portions of the P-type semiconductor regions 301 and 401 are offset from the photoelectric conversion portion side in the same pixel, with the end portion of the charge holding portion 102 being a reference. The N-type semiconductor region 106 constituting part of the photoelectric conversion portion 101 is disposed in the offset portion.

Figure 10:
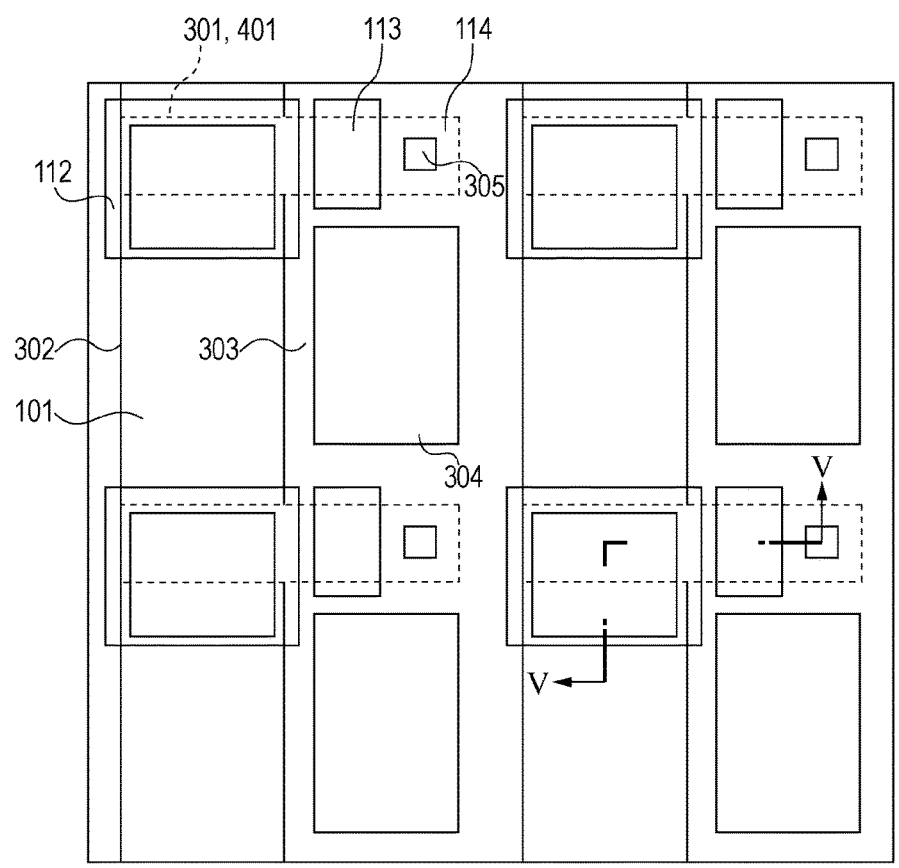
FIG. 10 is a top view of a pixel region of the solid-state image pickup device according to the fourth embodiment of the present invention.

FIG. 10 is a top view of a pixel region according to this embodiment. FIG. 10 illustrates only four pixels, but the solid-state image pickup device according to this embodiment may include more pixels. In FIG. 10, the region where the P-type semiconductor regions 301 and 401 are disposed is indicated by a broken line. FIG. 5 illustrates a schematic view of the V-V cross section in FIG. 10.

In this embodiment, the lower side of the rectangle representing the P-type semiconductor region 111 is the end portion on the photoelectric conversion portion side in the same pixel of the P-type semiconductor region 111. As illustrated in FIG. 10, the end portions on the photoelectric conversion portion side in the same pixel of the P-type semiconductor regions 301 and 401 are away from the photoelectric conversion portion 101 with respect to the end portion on the photoelectric conversion portion side in the same pixel of the P-type semiconductor region 111.

In this embodiment, in each of the plurality of pixels illustrated in FIG. 10, the end portions on the photoelectric conversion portion side of the P-type semiconductor regions 301 and 401 are offset from the photoelectric conversion portion 101. The solid-state image pickup device according to this embodiment may include pixels in which the end portions on the photoelectric conversion portion side of the P-type semiconductor regions 301 and 401 are not offset.

The configuration according to this embodiment may have sensitivity to light entering in an oblique direction. Accordingly, an effect that the sensitivity of the photoelectric conversion portion 101 increases can be obtained in addition to the effects of the first to third embodiments.

Fifth Embodiment

Figure 6:
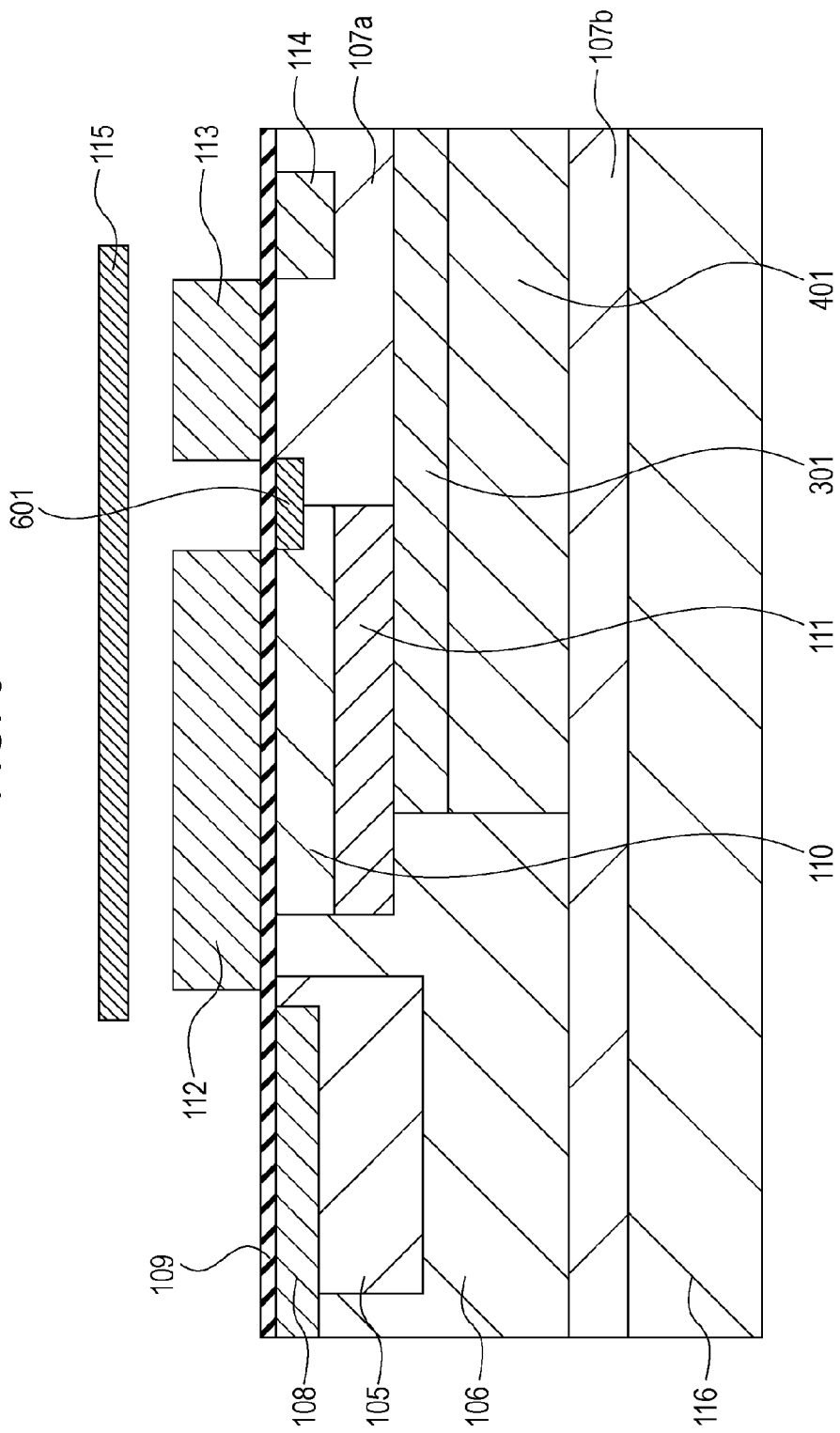
FIG. 6 is a schematic view of a cross section of a pixel of a solid-state image pickup device according to a fifth embodiment of the present invention.

FIG. 6 is a schematic view of a cross section of a pixel of a solid-state image pickup device according to a fifth embodiment of the present invention. The parts having the same function as those in the first to fourth embodiments are denoted by the same reference numerals, and a detailed description thereof will be omitted.

This embodiment is different from the first to fourth embodiments in that a P-type semiconductor region 601 is disposed on the semiconductor surface between the control electrode 112 and the transfer gate electrode 113. In this embodiment, the P-type semiconductor region 601 functions as a fourth semiconductor region.

The impurity concentration of the P-type semiconductor region 601 is higher than the impurity concentration of the N-type semiconductor region 110.

According to the configuration of this embodiment, inflow of a dark current in the transfer path between the charge holding portion 102 and the FD can be suppressed. Accordingly, an effect that noise is further reduced can be obtained in addition to the effects obtained in the first to fourth embodiments.

Sixth Embodiment

Figure 7:
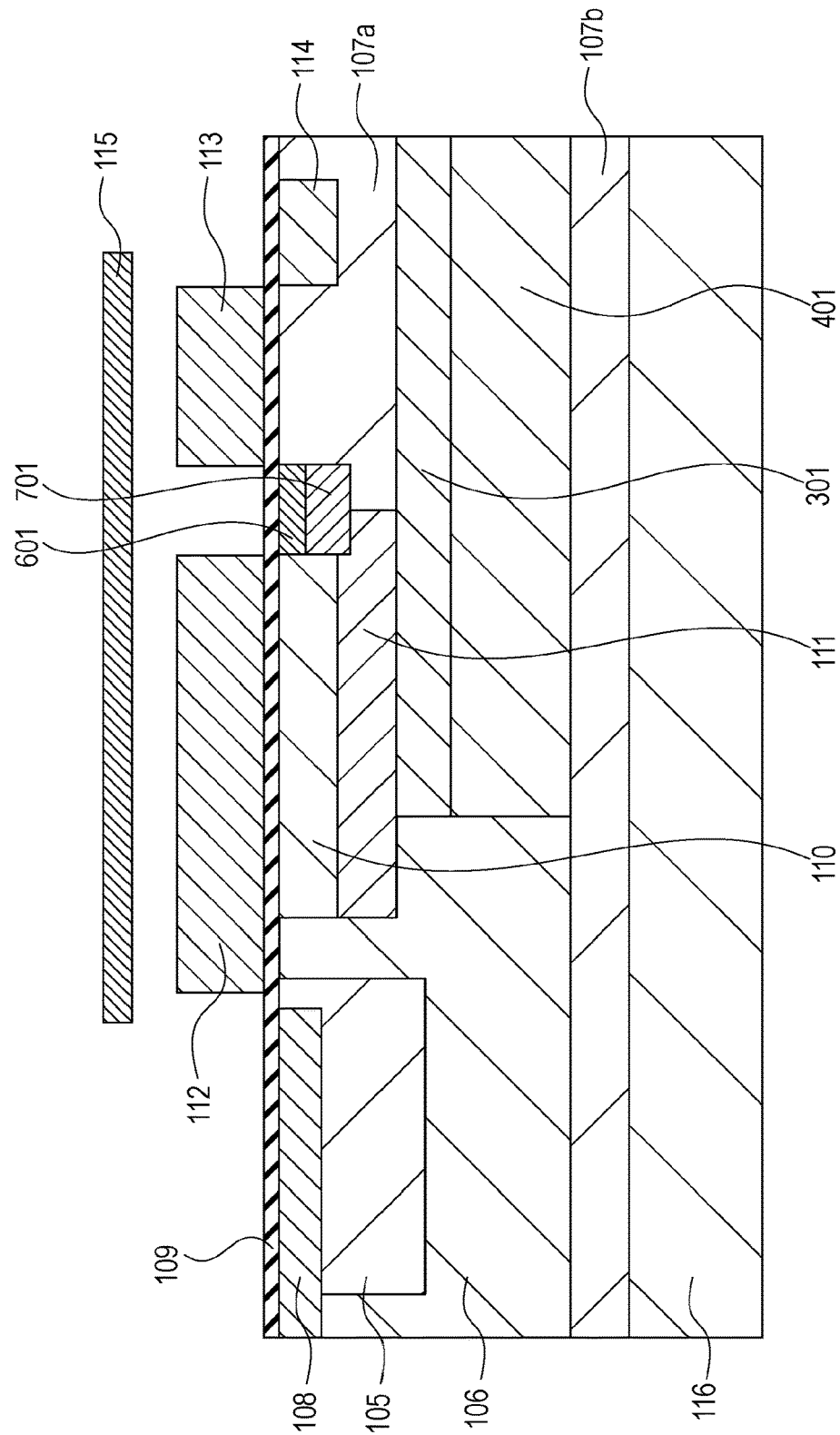
FIG. 7 is a schematic view of a cross section of a pixel of a solid-state image pickup device according to a sixth embodiment of the present invention.

FIG. 7 is a schematic view of a cross section of a pixel of a solid-state image pickup device according to a sixth embodiment of the present invention. The parts having the same function as those in the first to fifth embodiments are denoted by the same reference numerals, and a detailed description thereof will be omitted.

This embodiment is different from the fifth embodiment in that an N-type semiconductor region 701 is disposed immediately under the P-type semiconductor region 601. In this embodiment, the N-type semiconductor region 701 functions as a fifth semiconductor region.

As illustrated in FIG. 7, the PN junction interface between the N-type semiconductor region 701 and the P-type semiconductor region thereunder is at a deeper position than the PN junction interface between the N-type semiconductor region 110 and the P-type semiconductor region 111.

The impurity concentration of the P-type semiconductor region 601 and the impurity concentration of the N-type semiconductor region 701 are higher than the impurity concentration of the N-type semiconductor region 110, respectively. Thus, the end portion of the N-type semiconductor region 110 is determined by the arrangement of the semiconductor regions 601 and 701. The P-type semiconductor region 601 and the N-type semiconductor region 701 may be formed through a self-aligning process using, as a mask, the control electrode 112 and the transfer gate electrode 113 that are formed in advance. According to such a manufacturing method, the end portion of the N-type semiconductor region 110 and the end portion of the control electrode 112 can be easily aligned with high precision.

According to the configuration of this embodiment, transfer efficiency can be increased, so that charges can be transferred at a lower voltage.

Application of Solid-State Image Pickup Device

Figure 8:
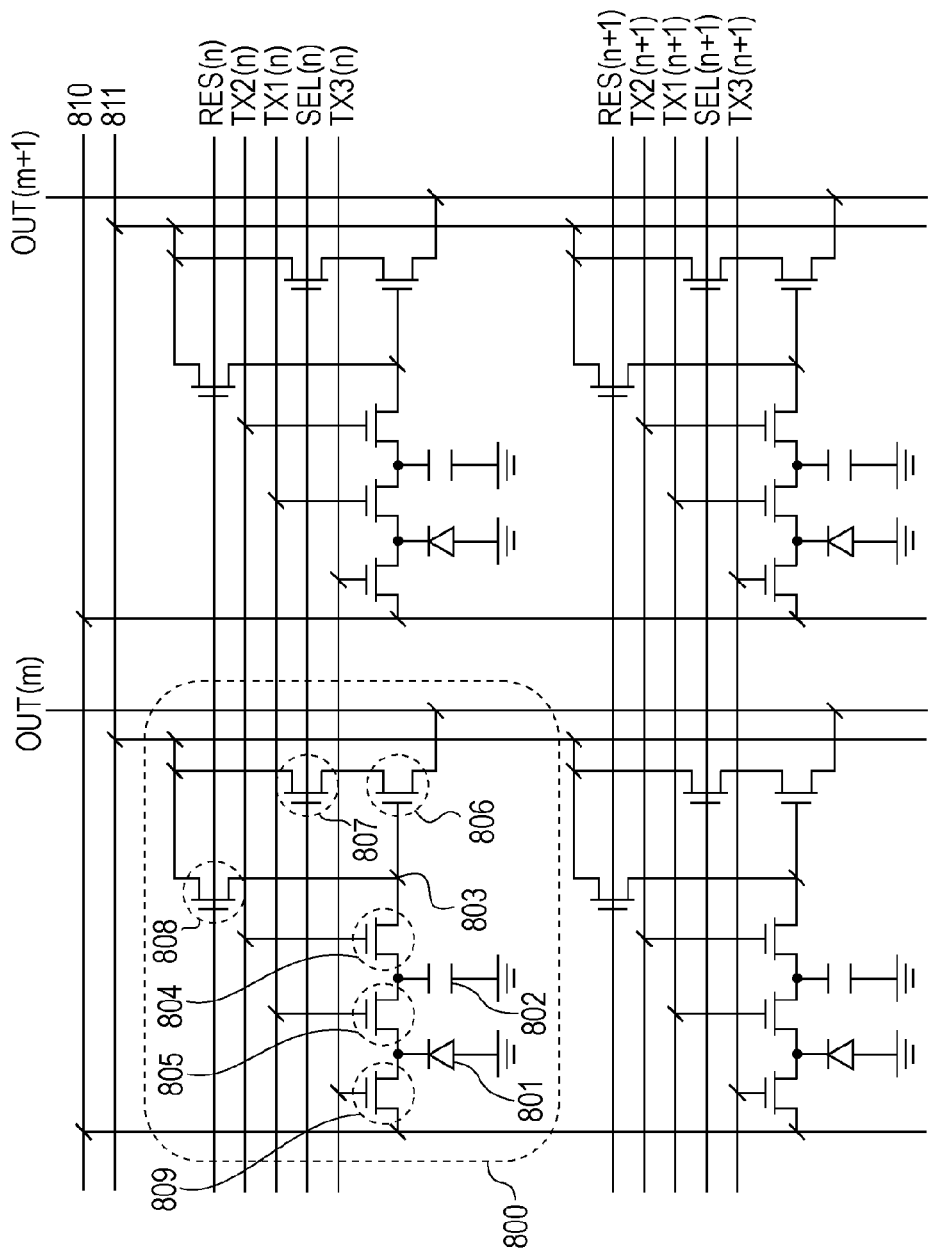
FIG. 8 is an equivalent circuit diagram of pixels of a solid-state image pickup device according to an embodiment of the present invention.

FIG. 8 is an equivalent circuit diagram of a solid-state image pickup device that can be applied to all the foregoing embodiments. The solid-state image pickup device having this equivalent circuit can perform a global electronic shutter operation.

Reference numeral 801 denotes a photoelectric conversion portion. A photodiode is used here. Reference numeral 802 denotes a charge holding portion, which holds signal charges generated by the photoelectric conversion portion 801. Reference numeral 803 denotes a sense node of an amplifying portion. For example, an FD and a gate electrode of an amplifying transistor that is electrically connected to the FD correspond to the sense node 803. Reference numeral 804 denotes a first transfer portion, which transfers charges in the charge holding portion 802 to the sense node 803 of the amplifying portion. Reference numeral 805 denotes a second transfer portion that is provided if necessary. The second transfer portion 805 transfers charges in the photoelectric conversion portion 801 to the charge holding portion 802. Reference numeral 808 denotes a reset portion, which supplies a reference voltage to at least an input portion of the amplifying portion. Furthermore, the reset portion 808 may supply a reference voltage to the charge holding portion 802. Reference numeral 807 denotes a selecting portion that is provided if necessary. The selecting portion 807 selectively outputs signals of respective pixel rows to a signal line. Reference numeral 806 denotes an amplifying portion. The amplifying portion 806 constitutes a source follower circuit together with a constant current source provided to the signal line. Reference numeral 809 denotes a discharge control portion, which controls the electrical connection between the photoelectric conversion portion 801 and a power supply line functioning as an overflow drain (hereinafter OFD).

Reference symbol RES denotes a wire for supplying a drive pulse to the reset portion 808. Reference symbol TX1 denotes a wire for supplying a drive pulse to the first transfer portion 804. Reference symbol TX2 denotes a wire for supplying a drive pulse to the second transfer portion 805. This wire can also serve as a wire for supplying a control pulse of the control electrode in the charge holding portion 802. Reference symbol SEL denotes a wire for supplying a drive pulse to the selecting portion 807.

The equivalent circuit is not limited thereto, and part of the configuration may be shared by a plurality of pixels. Also, the equivalent circuit is applicable to a configuration in which control wiring of individual elements is fixed to a constant voltage and in which control of conduction is not performed.

The second transfer portion 805 may have a buried channel MOS transistor configuration so that charges generated by the photoelectric conversion portion 801 immediately flow into the charge holding portion 802. In this configuration, there is a portion where an energy barrier is partially low at a portion deeper than a surface even in a non-conduction state. In this case, the charge transfer portion can be brought into a state where a certain voltage is supplied without performing active control. That is, a fixed potential barrier may be provided instead of a function as a transfer portion.

According to such a configuration, most of signal charges generated through photoelectric conversion when light enters the photoelectric conversion portion 801 can be transferred to the charge holding portion 802 without being accumulated in the photoelectric conversion portion 801. Accordingly, charge accumulation time can be made uniform in the photoelectric conversion portions 801 of all the pixels. Also, when the MOS transistor is in a non-conduction state, holes are accumulated on the surface of a channel, and the channel for transferring charges exists at a predetermined depth with respect to the surface. Thus, an influence of a dark current on the interface of an insulating film can be reduced.

From another point of view, during a period when signal charges are accumulated in the photoelectric conversion portion 801 and the charge holding portion 802, the potential of the charge path between the photoelectric conversion portion 801 and the charge holding portion 802 is lower than the potential of the charge path between the photoelectric conversion portion 801 and the OFD region. Here, the potential means the potential for signal charges.

In such a pixel configuration, charges can be transferred at a low voltage from the photoelectric conversion portion 801 to the charge holding portion 802, which is appropriate in terms of increasing charge transfer efficiency at a low voltage when the pixel configuration is combined with the embodiments of the present invention.

Furthermore, from the viewpoint of drive, charges moved from the photoelectric conversion portion 801 to the charge holding portion 802 in one exposure period are held in the charge holding portion 802 and are used as an image signal. That is, after one exposure period in the photoelectric conversion portion 801 starts, a signal is read from the pixel without through a reset operation of the charge holding portion 802. Note that one exposure period is commonly determined in the individual photoelectric conversion portions 801 when an image of one frame is captured.

In such a configuration, global exposure can be performed relatively easily, but the charges in the photoelectric conversion portion 801 are discharged to the OFD region during transfer from the charge holding portion 802 to the FD region. Thus, images are intermittent. In a case where continuity of images is particularly necessary in such a configuration, continuous images can be obtained by performing row by row exposure. Both can be switched as necessary.

Also, an embodiment of the present invention can be carried out also in a solid-state image pickup device in which a charge holding portion is provided in each pixel for increasing a dynamic range and in which charges are transferred from the charge holding portion to a sense node.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

REFERENCE SIGNS LIST

101 Photoelectric conversion portion
102 Charge holding portion

103 Transfer portion
104 Sense node
110 N-type semiconductor region
111 P-type semiconductor region
113 Transfer gate electrode

What is claimed is:

1. An image pickup device comprising:
    a photoelectric conversion portion including a first semiconductor region and configured to generate a charge in accordance with incident light, the first semiconductor region being of a first conductivity type;
    a charge holding portion including a second semiconductor region configured to hold the charge generated by the photoelectric conversion portion and provided in a semiconductor substrate, the second semiconductor region being of the first conductivity type;
    a floating diffusion region of the first conductivity type provided in the semiconductor substrate;
    a first transfer gate electrode provided on a region between the first semiconductor region and the second semiconductor region;
    a second transfer gate electrode provided on a region between the second semiconductor region and the floating diffusion region; and
    a third semiconductor region provided under the second semiconductor region and in the semiconductor substrate, the third semiconductor region being of a second conductivity type;
    a fourth semiconductor region provided under the first semiconductor region, the fourth semiconductor region being of the second conductivity type,
    wherein
    in a cross section of a pixel including the second semiconductor region, the third semiconductor region and the second transfer gate electrode, an impurity concentration at a first point within the third semiconductor region and on a first line oriented toward a depth direction of the semiconductor substrate and passing through the second semiconductor region is higher than an impurity concentration at a second point on a second line oriented toward the depth direction and passing through the second transfer gate electrode,
    the second point on the second line is at a same depth as the first point on the first line, and
    the third semiconductor region and the fourth semiconductor region are included in a continuous semiconductor region of the second conductivity type.

2. The image pickup device according to claim 1, wherein
    the first semiconductor region is provided laterally to the second semiconductor region,
    the second semiconductor region and the third semiconductor region are arranged along the depth direction,
    the first semiconductor region and the fourth semiconductor region are arranged along the depth direction,
    the continuous semiconductor region of the second conductivity type laterally extends from a position where the third semiconductor region is provided to a position where the fourth semiconductor region is provided.

3. The image pickup device according to claim 1, wherein the second semiconductor region and the third semiconductor region form a P-N junction.

4. The image pickup device according to claim 1, wherein an area of a projection of the second semiconductor region onto a plane parallel to a surface of the semiconductor substrate is substantially equal to an area of a projection of the third semiconductor region onto the plane parallel to the surface of the semiconductor substrate.

5. The image pickup device according to claim 4, wherein the second semiconductor region and the third semiconductor region are formed through a first impurity implantation step and a second impurity implantation step that is performed using a mask identical to a mask used in the first impurity implantation step.

6. The image pickup device according to claim 1, further comprising:
    a light shielding portion provided on the second semiconductor region.

7. The image pickup device according to claim 1,
    wherein a portion of the first semiconductor region is provided under the second semiconductor region.

8. The image pickup device according to claim 1,
    wherein an impurity concentration profile of the continuous semiconductor region has a plurality of peaks in the depth direction, and
    one peak of the plurality of peaks is provided in the third semiconductor region.

9. An image pickup device comprising:
    a photoelectric conversion portion configured to generate a charge in accordance with incident light;
    a charge holding portion including a first semiconductor region of a first conductivity type configured to hold the charge generated by the photoelectric conversion portion and provided in a semiconductor substrate;
    a floating diffusion region of the first conductivity type provided in the semiconductor substrate;
    a first transfer gate electrode provided on a region between the photoelectric conversion portion and the first semiconductor region of the first conductivity type;
    a second transfer gate electrode provided on a region between the first semiconductor region of the first conductivity type and the floating diffusion region; and
    a second semiconductor region of a second conductivity type provided under the first semiconductor region of the first conductivity type and in the semiconductor substrate,
    wherein
    in a cross section of a pixel including the first semiconductor region of the first conductivity type, the second semiconductor region of the second conductivity type and the second transfer gate electrode, an impurity concentration at a first point within the second semiconductor region of the second conductivity type and on a first line oriented toward a depth direction of the semiconductor substrate and passing through the first semiconductor region of the first conductivity type is higher than an impurity concentration at a second point on a second line oriented toward the depth direction and passing through the second transfer gate electrode at a center of the second transfer gate electrode, and
    the second point on the second line is at a same depth as the first point on the first line.

10. An image pickup device comprising:
    a photoelectric conversion portion configured to generate a charge in accordance with incident light;
    a charge holding portion including a first semiconductor region of a first conductivity type configured to hold the charge generated by the photoelectric conversion portion and provided in a semiconductor substrate;
    a floating diffusion region of the first conductivity type provided in the semiconductor substrate;
    a first transfer gate electrode provided on a region between the photoelectric conversion portion and the first semiconductor region of the first conductivity type;

a second transfer gate electrode provided on a region between the first semiconductor region of the first conductivity type and the floating diffusion region; and a second semiconductor region of a second conductivity type provided under the first semiconductor region of the first conductivity type and in the semiconductor substrate, wherein in a cross section of a pixel including the first semiconductor region of the first conductivity type, the second semiconductor region of the second conductivity type and the second transfer gate electrode, an impurity concentration at a first intersection between a first line oriented toward a depth direction of the semiconductor substrate and passing through the first semiconductor region of the first conductivity type and a third line parallel to a surface of the semiconductor substrate and passing through the second semiconductor region of the second conductivity type is higher than an impurity concentration at a second intersection between a second line oriented toward the depth direction and passing through the second transfer gate electrode at a center of the second transfer gate electrode and the third line.

11. The image pickup device according to claim 9, wherein an impurity concentration of the second conductivity type of the second semiconductor region of the second conductivity type is higher than an impurity concentration of the second conductivity type of a region that is under the second transfer gate electrode and that is at a same depth as the second semiconductor region of the second conductivity type.

12. The image pickup device according to claim 9, wherein the first semiconductor region of the first conductivity type and the second semiconductor region of the second conductivity type form a P-N junction.

13. The image pickup device according to claim 9, wherein an area of a projection of the first semiconductor region of the first conductivity type onto a plane parallel to a surface of the semiconductor substrate is substantially equal to an area of a projection of the second semiconductor region of the second conductivity type onto the plane parallel to the surface of the semiconductor substrate.

14. The image pickup device according to claim 13, wherein the first semiconductor region of the first conductivity type and the second semiconductor region of the second conductivity type are formed through a first impurity implantation step and a second impurity implantation step that is performed using a mask identical to a mask used in the first impurity implantation step.

15. The image pickup device according to claim 9, wherein a third semiconductor region of the second conductivity type is provided under the floating diffusion region.

16. The image pickup device according to claim 15, wherein a part of a semiconductor region of the first conductivity type included in the photoelectric conversion portion is provided under the second semiconductor region of the second conductivity type.

17. The image pickup device according to claim 16, wherein an impurity concentration profile of the third semiconductor region of the second conductivity type has a plurality of peaks in the depth direction.

18. The image pickup device according to claim 17, further comprising:

a light shielding portion provided on the second transfer gate electrode, wherein the second line is further passing through the light shielding portion, and the light shielding portion covers the first semiconductor region of the first conductivity type.

19. The image pickup device according to claim 18, wherein the first semiconductor region of the first conductivity type and the second semiconductor region of the second conductivity type are formed through a first impurity implantation step and a second impurity implantation step that is performed using a mask identical to a mask used in the first impurity implantation step.

20. The image pickup device according to claim 19, wherein the first semiconductor region of the first conductivity type and the second semiconductor region of the second conductivity type form a P-N junction.

* * * * *